United States Patent
Dong

(10) Patent No.: US 10,355,033 B2
(45) Date of Patent: Jul. 16, 2019

(54) MANUFACTURING METHOD OF POLYCRYSTALLINE SILICON THIN FILM AND MANUFACTURING METHOD OF THIN FILM TRANSISTOR ARRAY SUBSTRATE

(71) Applicant: WUHAN CHINA STAR OPTOELECTRONICS TECHNOLOGY CO., LTD, Wuhan, Hubei (CN)

(72) Inventor: Leilei Dong, Wuhan (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/575,054

(22) PCT Filed: Aug. 1, 2017

(86) PCT No.: PCT/CN2017/095514
§ 371 (c)(1),
(2) Date: Nov. 17, 2017

(87) PCT Pub. No.: WO2019/014966
PCT Pub. Date: Jan. 24, 2019

(65) Prior Publication Data
US 2019/0027513 A1    Jan. 24, 2019

(30) Foreign Application Priority Data
Jul. 18, 2017    (JP) ............................ 201710587277

(51) Int. Cl.
*H01L 27/12* (2006.01)
*H01L 27/32* (2006.01)
(Continued)

(52) U.S. Cl.
CPC .... *H01L 27/1274* (2013.01); *H01L 21/02532* (2013.01); *H01L 21/02592* (2013.01);
(Continued)

(58) Field of Classification Search
CPC ........... H01L 27/1274; H01L 21/02675; H01L 21/32115
See application file for complete search history.

(56) References Cited

U.S. PATENT DOCUMENTS

| 6,979,632 B1 * | 12/2005 | Ohtani ................ H01L 21/2022 438/487 |
| 2005/0142676 A1 * | 6/2005 | Oh .................... H01L 29/66757 438/22 |
| 2015/0287769 A1 | 10/2015 | Hsu |

FOREIGN PATENT DOCUMENTS

| CN | 104241140 A | 12/2014 |
| CN | 104362084 A | 2/2015 |

(Continued)

*Primary Examiner* — Charles D Garber
*Assistant Examiner* — Alia Sabur
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure discloses a manufacturing method of a polycrystalline silicon thin film, which includes: forming a first amorphous silicon thin film; crystallizing the first amorphous silicon thin film to form a polycrystalline silicon thin film by applying an excimer laser annealing process; forming a second amorphous silicon thin film on a first surface of the polycrystalline silicon thin film; and etching until the second amorphous silicon thin film is completely removed toward a direction of the polycrystalline silicon thin film from the second amorphous silicon thin film by applying a dry etching process. The present disclosure further discloses a manufacturing method of a thin film transistor array substrate which includes the steps of manu- (Continued)

facturing an active layer: forming a layer of a polycrystalline silicon thin film according to the previous polycrystalline silicon thin film; and etching the polycrystalline silicon thin film to form a patterned active layer.

9 Claims, 7 Drawing Sheets

(51) Int. Cl.
| | |
|---|---|
| *H01L 29/49* | (2006.01) |
| *H01L 29/45* | (2006.01) |
| *H01L 21/02* | (2006.01) |
| *H01L 21/3065* | (2006.01) |
| *H01L 29/66* | (2006.01) |
| *H01L 29/786* | (2006.01) |
| *G02F 1/1368* | (2006.01) |

(52) U.S. Cl.
CPC .... *H01L 21/02675* (2013.01); *H01L 21/3065* (2013.01); *H01L 27/1222* (2013.01); *H01L 29/458* (2013.01); *H01L 29/4908* (2013.01); *H01L 29/66757* (2013.01); *H01L 29/78675* (2013.01); *G02F 1/1368* (2013.01); *G02F 2001/13685* (2013.01); *H01L 27/3262* (2013.01)

(56) References Cited

FOREIGN PATENT DOCUMENTS

| CN | 104485276 A | 4/2015 |
|---|---|---|
| CN | 104752203 A | 7/2015 |

\* cited by examiner

MANUFACTURING METHOD OF POLYCRYSTALLINE SILICON THIN FILM AND MANUFACTURING METHOD OF THIN FILM TRANSISTOR ARRAY SUBSTRATE

CROSS-REFERENCES TO RELATED APPLICATIONS

This application is a U.S. national phase application, pursuant to 35 U.S.C. § 371, of PCT/CN2017/095514, filed Aug. 1, 2017, designating the United States, which claims priority to Chinese Application No. 201710587277.2, filed Jul. 18, 2017. The entire contents of the aforementioned patent applications are incorporated herein by this reference.

TECHNICAL FIELD

The present disclosure relates to a manufacturing process of a semiconductor component, especially to a manufacturing method of a polycrystalline silicon thin film, and further relates to a manufacturing method of a thin film transistor array substrate.

BACKGROUND ART

A flat panel display device has many advantages, such as thin body, power saving and no radiation, etc., and has been widely applied. Current flat panel display devices mainly include a Liquid Crystal Display (LCD) and an Organic Light Emitting Display (OLED). A Thin Film Transistor (TFT) is an important constituent part of the flat panel display device, may be formed on a glass substrate or a plastic substrate and is generally used as a switch device and a driving device to be applied to an LCD and an OLED.

A polycrystalline silicon (Poly-Si) thin film is formed by many small grains having different sizes and different crystal orientations, the sizes of the grains are generally from tens to hundreds of nanometers, and the sizes of large grains may reach several micrometers. A polycrystalline silicon thin film having large grains has a comparatively high mobility which is close to the mobility of a bulk material, thus, the polycrystalline silicon thin film has been widely applied to the manufacturing of a semiconductor component. For example, a thin film transistor in an LCD or OLED product is most adopted with a polycrystalline silicon thin film as an active layer.

The current manufacturing method of a polycrystalline silicon thin film mainly includes manufacturing an amorphous silicon thin film first and then performing a crystallization process on the amorphous silicon thin film to obtain a polycrystalline silicon thin film. Wherein Excimer Laser Anneal (ELA) is a commonly used method, which mainly performs a laser irradiation to an amorphous silicon thin film through an excimer laser having a certain amount of energy and enables the amorphous silicon to be transformed into a polycrystalline silicon at high temperature using the energy of the excimer laser. During a process of transforming an amorphous silicon to a polycrystalline silicon at high temperature using the ELA method, variant bumps are inevitably generated on a surface of the obtained polycrystalline silicon thin film, and have an impact on subsequent manufacturing processes and finally on stability of an electrical performance of a thin film transistor to reduce quality of a product.

SUMMARY

For this purpose, the present disclosure provides a manufacturing method for a polycrystalline silicon thin film to improve manufacturing of a polycrystalline silicon thin film using an ELA method and reduce a surface roughness of the obtained polycrystalline silicon thin film to improve quality of a product.

The present disclosure provides a manufacturing method of a polycrystalline silicon thin film, which includes: forming a first amorphous silicon thin film by applying a semiconductor deposition process; crystallizing the first amorphous silicon thin film to form a polycrystalline silicon thin film by applying an excimer laser annealing process; forming a second amorphous silicon thin film on a first surface of the polycrystalline silicon thin film by applying a semiconductor deposition process; and etching until the second amorphous silicon thin film is completely removed toward a direction of the polycrystalline silicon thin film from the second amorphous silicon thin film by applying a dry etching process, wherein the etching is performed to below the first surface while the dry etching process is performed. Etching speeds may be equal everywhere within a whole plane while the dry etching process is performed. The dry etching process may be a plasma etching process. Before the excimer laser annealing process is performed, a thermal dehydrogenation process may be further performed on the first amorphous silicon thin film. The temperature of the thermal dehydrogenation process may be 350~450° C.

The present disclosure further provides a manufacturing method of a thin film transistor array substrate which includes the steps of manufacturing an active layer: forming a layer of a polycrystalline silicon thin film according to the above mentioned manufacturing method of the polycrystalline silicon thin film; and etching the polycrystalline silicon thin film by applying a photolithography process to form a patterned active layer. The method particularly may include: providing a substrate and forming a patterned active layer on the substrate (S1); forming a gate insulating layer on the active layer (S2); forming a patterned gate electrode on the gate insulating layer (S3); forming an interlayer medium layer on the gate electrode (S4); etching in the interlayer medium layer and the gate insulating layer to form a first via hole and a second via hole exposing the active layer (S5); forming a patterned active electrode and drain electrode on the interlayer medium layer, the source electrode being connected to the active layer through the first via hole and the drain electrode being connected to the active layer through the second via hole (S5); forming a planarizing layer on the source electrode and the drain electrode (S7); etching in the planarizing layer to form a third via hole exposing the source electrode or the drain electrode (S8); and forming a patterned pixel electrode on the planarizing layer, the pixel electrode being connected to the source electrode or the drain electrode through the third via hole (S9).

The manufacturing method of the polycrystalline silicon thin film provided in the embodiments of the present disclosure includes: firstly, covering a layer of amorphous silicon thin film on a polycrystalline silicon thin film after transforming an amorphous silicon thin film into a polycrystalline silicon thin film using an ELA method, then etching to completely remove the amorphous silicon thin film by using a dry etching process, and meanwhile uniformly etching to remove variant bumps on a surface of the polycrystalline silicon thin film during the etching to remove the amorphous silicon thin film, thereby reducing a surface roughness of the obtained polycrystalline silicon thin film, and a polycrystalline silicon thin film having a smooth and uniform surface may improve stability of an electrical performance thereof.

DETAILED DESCRIPTION

Figure 1A:
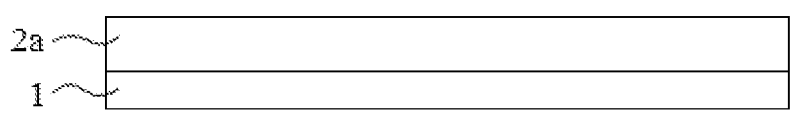
FIGS. 1A-1D are illustrative diagrams of a component structure correspondingly obtained by respective steps in a manufacturing method of a polycrystalline silicon thin film provided by an embodiment 1 of the present disclosure.

In order for the purpose, technical solution and advantages of the present disclosure to be clearer, the embodiments of the present disclosure will be further explained below in conjunction with the drawings. The preferred embodiments are exemplified in the drawings. The embodiments of the present disclosure as shown in the drawings and as described according to the drawings are only exemplified, and the present disclosure is not limited to these embodiments.

Here, it is also worthy explaining that, in order to prevent the present disclosure from being obscured due to unnecessary details, the drawings only illustrate the structure and/or processing steps closely related to the solution based on the present disclosure, while other details less related to the present disclosure are omitted.

Embodiment 1

The present embodiment provides a manufacturing method of a polycrystalline silicon thin film. Referring to FIGS. 1A to 1D, the method includes:

At S11 as shown in FIG. 1A, providing a substrate 1 and forming a first amorphous silicon thin film 2a on the substrate 1 by applying a semiconductor deposition process. Wherein the substrate 1 may be a glass substrate. The semiconductor deposition process may be adopted by a chemical vapor deposition process.

Figure 1B:
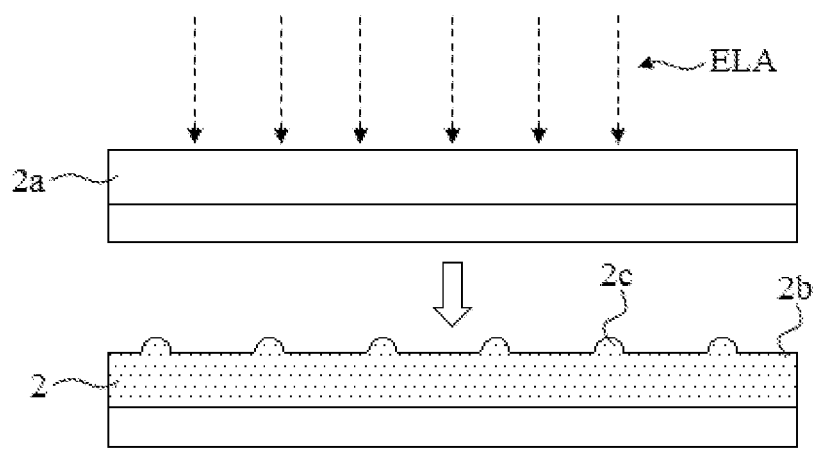

At S12 as shown in FIG. 1B, crystallizing the first amorphous silicon thin film 2a to form a polycrystalline silicon thin film 2 by applying an excimer laser annealing process (ELA). In this step, since the impact of the ELA process itself, variant bumps 2c are inevitably generated on a first surface (an upper surface) 2b of the obtained polycrystalline silicon thin film 2.

Figure 1C:
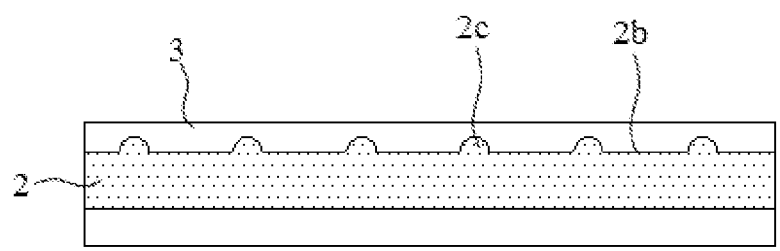

At S13 as shown in FIG. 1C, a second amorphous silicon thin film 3 is formed on the first surface 2b of the polycrystalline silicon thin film 2 by applying a semiconductor deposition process. Wherein the semiconductor deposition process may be adopted by a chemical vapor deposition process, and the second amorphous silicon thin film 3 totally covers the first surface 2b of the polycrystalline silicon thin film 2 and the variant bumps 2c on the first surface 2b.

Figure 1D:
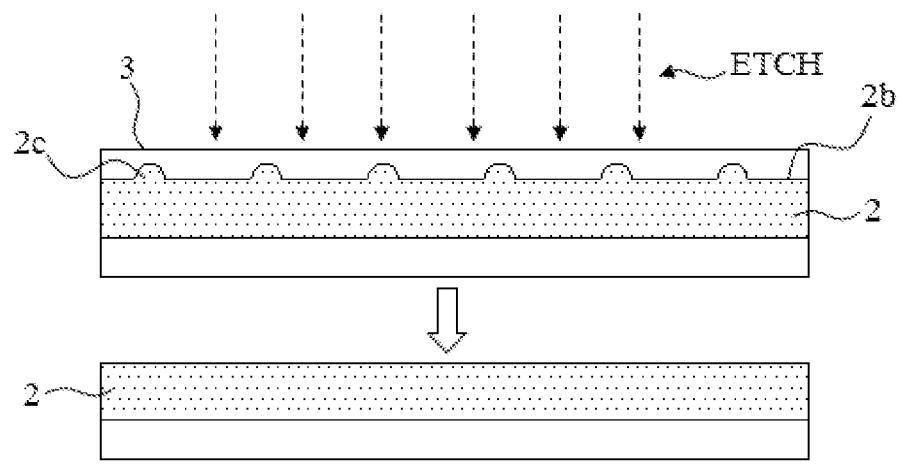

At S14 as shown in FIG. 1D, etching until the second amorphous silicon thin film 3 is completely removed toward a direction of the polycrystalline silicon thin film from the second amorphous silicon thin film by applying a dry etching process (ETCH). Wherein the variant bumps 2c on the first surface 2b of the polycrystalline silicon thin film 2 are also etched to be removed simultaneously while etching to remove the second amorphous silicon thin film 3, accordingly, a surface of the finally obtained polycrystalline silicon thin film 2 is smoother and uniformer, and stability of an electrical performance thereof is improved.

In a preferred solution, in the step S14, the dry etching process is selected as a plasma etching process. Etching speeds shall be controlled to be approximately equal, and better to be exactly equal everywhere within a whole plane while the dry etching process is performed.

In a preferred solution, in the step S14, the etching is performed to below the first surface 2b to ensure variant bumps 2c can be completely etched and removed, while the dry etching process is performed, to obtain the polycrystalline silicon thin film 2 having a smooth and uniform surface.

In a preferred solution, before performing the ELA process of the step S12, a thermal dehydrogenation process is further performed on the first amorphous silicon thin film 2a, thereby making the finally obtained polycrystalline silicon thin film 2 have a better electrical performance. Specifically, the temperature of the thermal dehydrogenation process may be selected as 350~450° C.

Embodiment 2

Figure 2A:
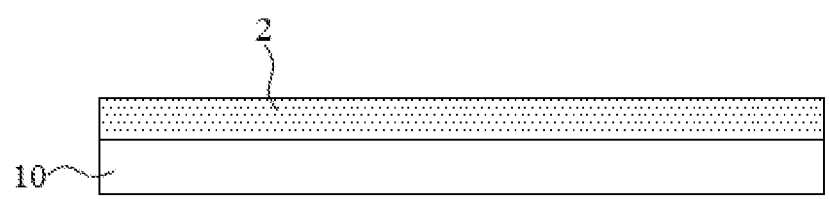
FIGS. 2A-2J are illustrative diagrams of a component structure correspondingly obtained by respective steps in a manufacturing method of a thin film transistor array substrate provided by an embodiment 2 of the present disclosure.

The present embodiment provides a manufacturing method of a thin film transistor array substrate, and referring to FIGS. 2A to 2J, the method includes:

At S21 forming a patterned active layer 20 on a substrate 10. The step may particularly include:

as shown in FIG. 2A, firstly, adopting the manufacturing method of a polycrystalline silicon thin film provided by the embodiment 1, and obtaining a polycrystalline silicon thin film 2 on the substrate 10. Preferably, before depositing a first amorphous silicon thin film, a buffer layer may be first manufactured on the substrate 10, and then the polycrystalline silicon thin film 2 is formed on the buffer layer. The buffer layer may be a $SiO_x$ layer or a $SiN_x$ layer or a composite structural layer laminated by a $SiO_x$ layer and a $SiN_x$ layer.

Figure 2B:
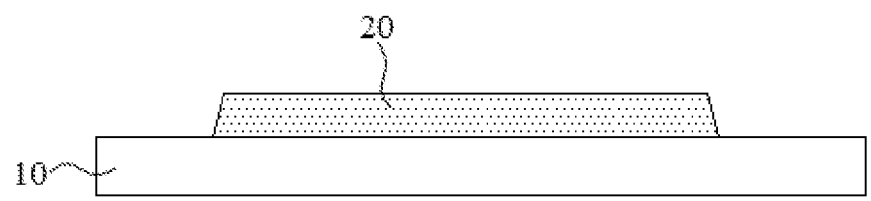

As shown in FIG. 2B, the polycrystalline silicon thin film 2 is etched by applying a photolithography process to form the patterned active layer 20.

Figure 2C:
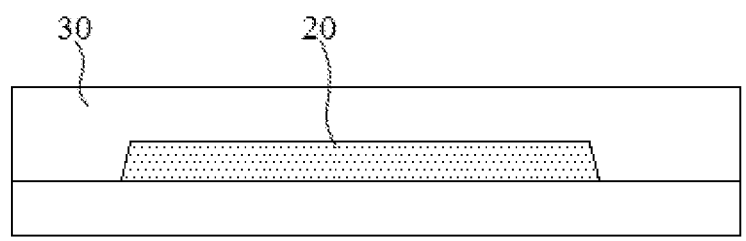

At S22 as shown in FIG. 2C, forming a gate insulating layer 30 on the active layer 20. Specifically, the gate insulating layer 30 may be a $SiO_x$ layer or a $SiN_x$ layer or a composite structural layer laminated by a $SiO_x$ layer and a $SiN_x$ layer.

Figure 2D:
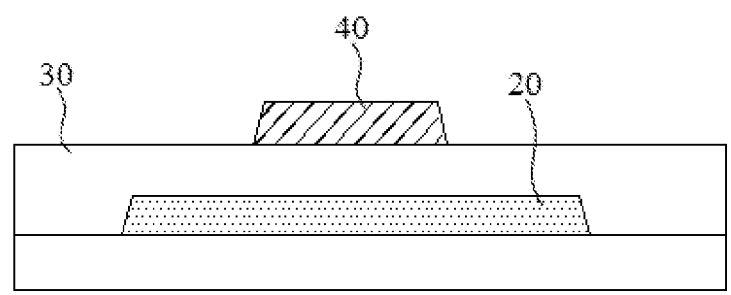

At S23 as shown in FIG. 2D, forming a patterned gate electrode 40 on the gate insulating layer 30 by applying a photolithography process. Specifically, the gate electrode 40 is relatively located right above the patterned active layer 20. The material of the gate electrode 40 is selected from but not limited to one or more of Cr, Mo, Al and Cu, and the gate electrode 40 may be one or more layers of stack.

Figure 2E:
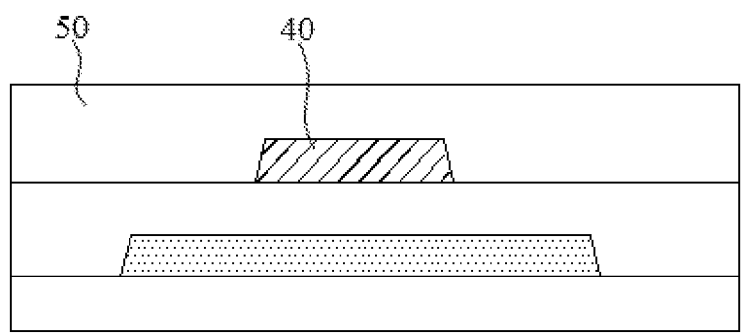

At S24 as shown in FIG. 2E, forming an interlayer medium layer 50 on the gate electrode 40. Specifically, the interlayer medium layer 50 may be a $SiO_x$ layer or a $SiN_x$ layer or a composite structural layer laminated by a $SiO_x$ layer and a $SiN_x$ layer.

Figure 2F:
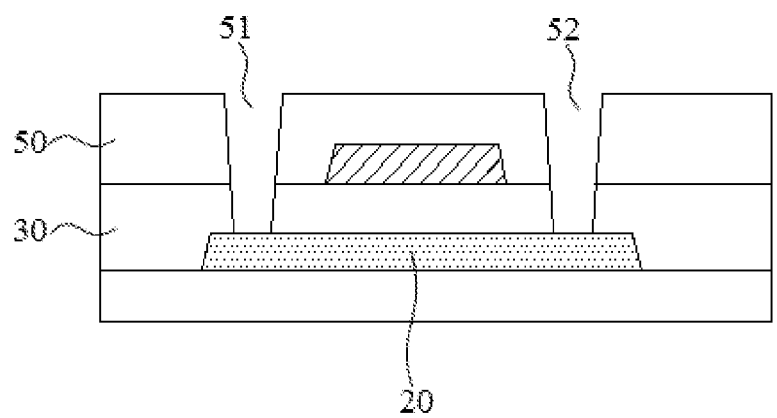

At S25 as shown in FIG. 2F, etching in the interlayer medium layer 50 and the gate insulating layer 30 by applying a photolithography process to form a first via hole 51 and a second via hole 52 exposing the active layer 20.

Figure 2G:
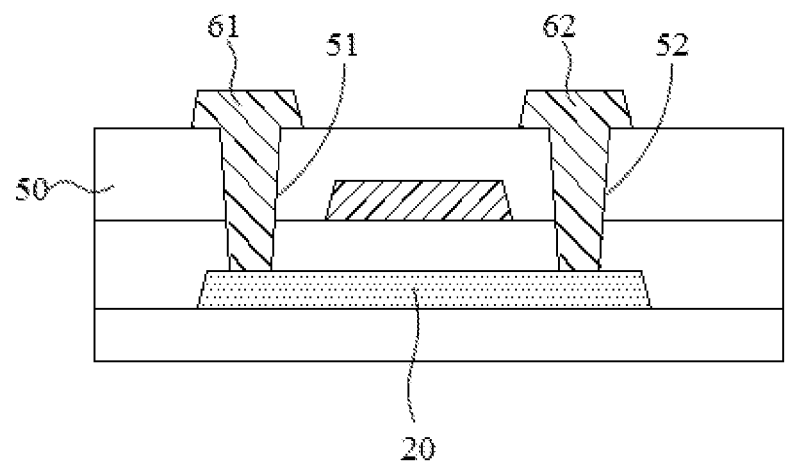

At S26 as shown in FIG. 2G, forming a patterned source electrode 61 and drain electrode 62 on the interlayer medium layer 50 by applying a photolithography process. The source electrode 61 is connected to the active layer 20 through a first via hole 51, and the drain electrode 62 is connected to the active layer 20 through a second via hole 52. Wherein the materials of the source electrode 61 and the drain electrode 62 are selected from but not limited to one or more of Cr, Mo, Al and Cu, and the source electrode and the drain electrode may be one or more layers of stack.

Figure 2H:
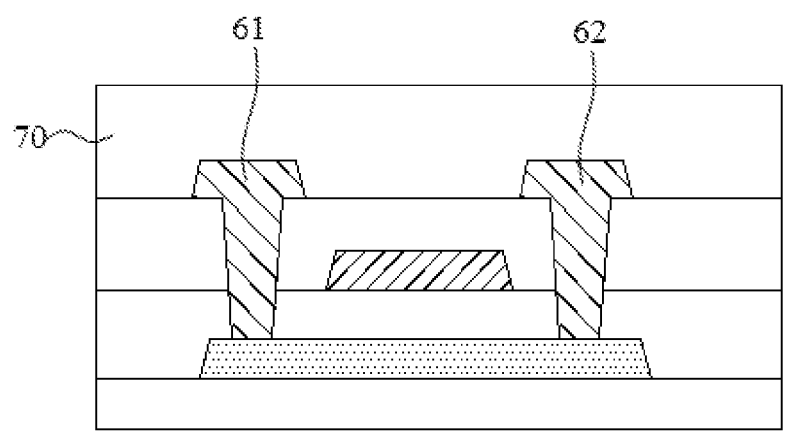

At S27 as shown in FIG. 2H, forming a planarizing layer 70 on the source electrode 61 and the drain electrode 62. Specifically, the planarizing layer 70 may be a $SiO_x$ layer or a $SiN_x$ layer or a composite structural layer laminated by a $SiO_x$ layer and a $SiN_x$ layer.

Figure 2I:
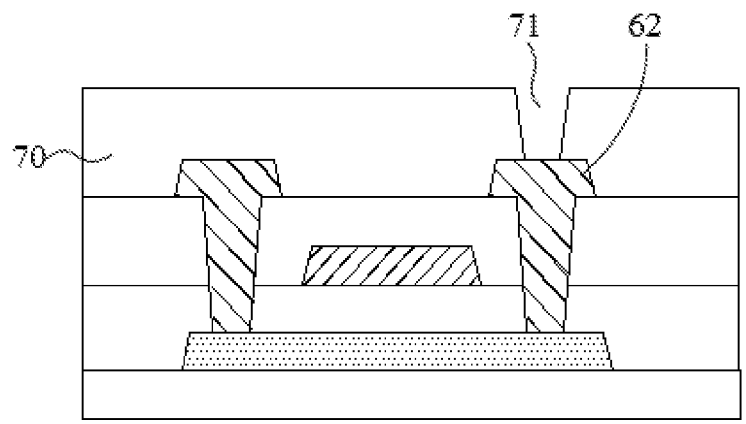

At S28 as shown in FIG. 2I, etching in the planarizing layer 70 by applying a photolithography process to form a third via hole 71 exposing the drain electrode 62.

Figure 2J:
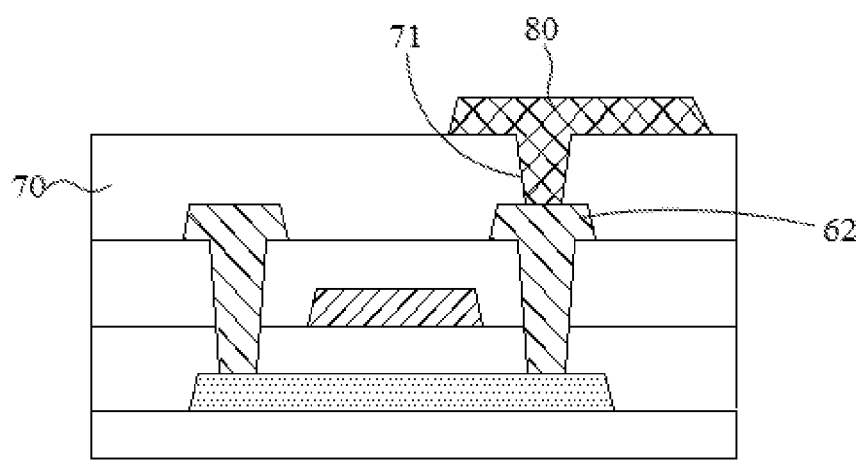

At S29 as shown in FIG. 2J, forming a patterned pixel electrode 80 by applying a photolithography process on the planarizing layer 70, the pixel electrode 80 being connected to the drain electrode 62 through the third via hole 71.

It needs to be explained that, in the step S28, the third via hole 71 may also be disposed to correspond to a position of the source electrode 61, at this point, in the step S29, the pixel electrode 80 is connected to the source electrode 61 through the third via hole 71.

In the above processes, a photolithography process (a patterning process) is adopted in a plurality of steps. Wherein each photolithography process includes processes such as masking, exposing, developing, etching, peeling and the like, wherein the etching process includes a dry etching and a wet etching. The photolithography process has been a comparatively mature technology in the art, and no more detailed explanations thereof are given here.

In addition, in the thin film transistor array substrate obtained in the present embodiment, the thin film transistor is a top gate type thin film transistor. In another some embodiments, the manufacturing method of the polycrystalline silicon thin film provided by the embodiment 1 may also be applied to the manufacturing process of a bottom gate type thin film transistor array substrate.

The manufacturing method of the polycrystalline silicon thin film provided in the above embodiments is applied to the manufacturing process of a thin film transistor array substrate, and includes: firstly, covering a layer of amorphous silicon thin film on a polycrystalline silicon thin film after transforming an amorphous silicon thin film into a polycrystalline silicon thin film using an ELA method, then etching to completely remove the amorphous silicon thin film using a dry etching process, and meanwhile uniformly etching to remove variant bumps on a surface of the polycrystalline silicon thin film during the etching to remove the amorphous silicon thin film, thereby reducing a surface roughness of the obtained polycrystalline silicon thin film, and a polycrystalline silicon thin film having a smooth and uniform surface may improve stability of an electrical performance thereof, and also further improves a quality of a final product (for example, a LCD or an OLED).

It needs to be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further includes inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinarily skilled in the art, several improvements and polish can be made without breaking away from the principle of the present application, also those improvements and polish should be considered as the protection scope of the present application.

What is claimed is:

1. A manufacturing method of a thin film transistor array substrate comprising:

S1, providing a substrate and forming a patterned active layer on the substrate, wherein forming the active layer comprises;

forming a first amorphous silicon thin film by applying a semiconductor deposition process;

crystallizing the first amorphous silicon thin film to form a polycrystalline silicon thin film by applying an excimer laser annealing process;

forming a second amorphous silicon thin film on a first surface of the polycrystalline silicon thin film by applying a semiconductor de position process;

etching until the second amorphous silicon thin film is completely removed toward a direction of the polycrystalline silicon thin film from the second amorphous silicon thin film by applying a dry etching process; and etching the polycrystalline silicon thin film by applying a photolithography process to form the patterned active layer;

S2, forming a gate insulating layer on the active layer;

S3, forming a patterned gate electrode on the gate insulating layer;

S4, forming an interlayer medium layer on the gate electrode, wherein the step S4 is performed immediately after the step S3;

S5, etching in the interlayer medium layer and the gate insulating layer to form a first via hole and a second via hole exposing the active layer;

S6, forming a patterned source and drain electrode on the interlayer medium layer, the source electrode being connected to the active layer through the first via hole and the drain electrode being connected to the active layer through the second via hole;

S7, forming a planarizing layer on the source electrode and the drain electrode;

S8, etching in the planarizing layer to form a third via hole exposing the source electrode or the drain electrode; and S9, forming a patterned pixel electrode on the planarizing layer, the pixel electrode being connected to the source electrode or the drain electrode through the third via hole.

2. The manufacturing method of a thin film transistor array substrate of claim 1, wherein in the step S1, a buffer layer is first manufactured on the substrate, and then the patterned active layer is formed on the buffer layer.

3. The manufacturing method of a thin film transistor array substrate of claim 1, wherein the gate insulating layer may be a SiOx layer or a SiNx layer or a composite structural layer laminated by a SiOx layer and a SiNx layer; and the interlayer medium layer is a SiOx layer or a SiNx layer or a composite structural layer laminated by a SiOx layer and a SiNx layer.

4. The manufacturing method of a thin film transistor array substrate of claim 1, wherein the material of the gate electrode comprises one or more of Cr, Mo, Al and Cu, the gate electrode comprising one or a plurality of stacked layers; and the materials of the source electrode and the drain electrode comprises one or more of Cr, Mo, Al and Cu, the source electrode and the drain electrode comprising one or a plurality of stacked layers.

5. The manufacturing method of a thin film transistor array substrate of claim 1, wherein the etching is performed to below the first surface while the dry etching process is performed.

6. The manufacturing method of a thin film transistor array substrate of claim 1, wherein etching speeds are equal everywhere within a whole plane while the dry etching process is performed.

7. The manufacturing method of a thin film transistor array substrate of claim 1, wherein the dry etching process is a plasma etching process.

8. The manufacturing method of a thin film transistor array substrate of claim 1, wherein before the excimer laser annealing process is performed, a thermal dehydrogenation process is further performed on the first amorphous silicon thin film.

9. The manufacturing method of a thin film transistor array substrate of claim 1, wherein the temperature of the thermal dehydrogenation process is 350~450° C.

* * * * *